(12) United States Patent
Zhong

(10) Patent No.: US 12,016,160 B2
(45) Date of Patent: Jun. 18, 2024

(54) DIVERSION SYSTEM AND COOLING SYSTEM APPLICABLE TO COOLING DEVICE

(71) Applicant: Alibaba Group Holding Limited, Grand Cayman (KY)

(72) Inventor: Yangfan Zhong, Shenzhen (CN)

(73) Assignee: Alibaba Group Holding Limited, Grand Cayman (KY)

( * ) Notice: Subject to any disclaimer, the term of this patent is extended or adjusted under 35 U.S.C. 154(b) by 774 days.

(21) Appl. No.: 16/961,585

(22) PCT Filed: Jan. 22, 2019

(86) PCT No.: PCT/CN2019/072675
§ 371 (c)(1),
(2) Date: Sep. 28, 2020

(87) PCT Pub. No.: WO2019/149113
PCT Pub. Date: Aug. 8, 2019

(65) Prior Publication Data
US 2021/0015000 A1    Jan. 14, 2021

(30) Foreign Application Priority Data

Feb. 2, 2018  (CN) .......................... 201810107239.7

(51) Int. Cl.
*H05K 7/20* (2006.01)
*B01D 29/60* (2006.01)
*B01D 35/027* (2006.01)

(52) U.S. Cl.
CPC ........... *H05K 7/2079* (2013.01); *B01D 29/60* (2013.01); *B01D 35/027* (2013.01); *H05K 7/20272* (2013.01)

(58) Field of Classification Search
CPC ............ H05K 7/2079; H05K 7/20272; H05K 7/20236; H05K 7/20763; B01D 29/60; B01D 35/027
See application file for complete search history.

(56) References Cited

U.S. PATENT DOCUMENTS 5,293,754 A   3/1994  Mizuno
6,360,559 B1  3/2002  Midorikawa
(Continued)

FOREIGN PATENT DOCUMENTS

CN       1654185 A  *  8/2005  ........... B29C 35/007
CN     102483641 A      5/2012
(Continued)

*Primary Examiner* — Emmanuel E Duke

(57) ABSTRACT

A diversion system and a cooling system, the diversion system comprising a storage tank and a pumping apparatus, the storage tank is used for storing a cooling medium, and the pumping apparatus comprises an inlet and an outlet. First pipeline is connected between a cooling device and the outlet of the pumping apparatus, second pipeline is connected between the storage tank and the outlet of the pumping apparatus, third pipeline is connected between the cooling device and the inlet of the pumping apparatus, fourth pipeline is connected between the storage tank and the inlet of the pumping apparatus, and first pipeline, second pipeline, third pipeline, and fourth pipeline selectively conducting or closed. When the diversion system is operating, first or second pipelines is conducting, and third or fourth pipelines is conducting; and the pumping apparatus extracts the cooling medium by one of third or fourth pipelines that is conducting, and conveys the cooling medium externally by first or second pipelines that is conducting.

20 Claims, 11 Drawing Sheets

(56) References Cited

U.S. PATENT DOCUMENTS

| | | |
|---|---|---|
| 6,859,366 B2 | 2/2005 | Fink |
| 7,867,070 B2 | 1/2011 | Day |
| 8,432,690 B2 | 4/2013 | Fink et al. |
| 8,593,815 B2 | 11/2013 | Claassen et al. |
| 9,027,360 B2 | 5/2015 | Chainer et al. |
| 9,426,932 B2 | 8/2016 | Kinstle et al. |
| 9,552,025 B2 | 1/2017 | Samadiani et al. |
| 9,681,589 B1 | 6/2017 | Ross et al. |
| 9,769,960 B2 | 9/2017 | LeFebvre et al. |
| 2005/0225936 A1 | 10/2005 | Day |
| 2011/0203785 A1 | 8/2011 | Federspiel et al. |
| 2014/0052429 A1 | 2/2014 | Kelkar et al. |
| 2014/0268550 A1 | 9/2014 | Kinstle et al. |
| 2014/0321050 A1 | 10/2014 | Sato et al. |

FOREIGN PATENT DOCUMENTS

| | | |
|---|---|---|
| CN | 103249284 | 8/2013 |
| CN | 103605412 A | 2/2014 |
| CN | 106168156 | 11/2016 |
| CN | 106839504 | 6/2017 |
| CN | 107588328 | 1/2018 |
| DE | 202016107445 U1 | 4/2017 |
| EP | 2609800 B1 | 7/2013 |
| FR | 3015645 | 6/2015 |
| JP | 2003269779 A * | 9/2003 |
| JP | 2011117486 A * | 6/2011 |
| WO | 2016036316 A1 | 3/2016 |

* cited by examiner

DIVERSION SYSTEM AND COOLING SYSTEM APPLICABLE TO COOLING DEVICE

The present application is a U.S. National Stage Application under 35 U.S.C. 371 of PCT Patent Application No. PCT/CN2019/072675 filed Jan. 22, 2019, which claims priority to China Patent Application No. 201810107239.7, filed on Feb. 2, 2018 and entitled "DIVERSION SYSTEM AND COOLING SYSTEM APPLICABLE TO COOLING DEVICE", which are incorporated herein by reference in their entirety.

TECHNICAL FIELD

The present invention relates to cooling devices and in particular to a diversion system and a cooling system applicable to cooling devices.

BACKGROUND

With the rapid development of cloud computing technology (i.e., large-scale distributed system technology), the requirements for computing performance of servers have become increasingly high. When the performance of servers improves, the power consumption rapidly increases, and the power consumption of cabinets increases in multiples. The data shows that in the recent decade, the power density of data center cabinets has increased by nearly 15 times. In the past, the power consumption of a cabinet was generally 1.5 kW to 2 kW, but now, some cabinets have local power consumption reaching 20 kW to 30 kW.

Cooling devices commonly used in data centers are filled with cooling media. A server that needs to be cooled is placed in the cooling device, and the server is cooled by means of the cooling media. During use, according to actual needs, the cooling device is replenished with cooling media or redundant cooling media in the cooling device are recovered. Generally, two pipelines are required to complete the cooling medium replenishment and cooling medium recovery.

SUMMARY

The present invention provides for a diversion and a cooling system applicable to a cooling device, so that replenishment and recovery of a cooling medium in the cooling device can be implemented by means of only one pumping apparatus.

An embodiment of the present invention provides a diversion system applicable to a cooling device, the system comprising: a storage tank and a pumping apparatus, the storage tank used for storing a cooling medium, and the pumping apparatus comprising an inlet and an outlet.

In embodiments, a first pipeline is connected between the cooling device and the outlet of the pumping apparatus, a second pipeline is connected between the storage tank and the outlet of the pumping apparatus, a third pipeline is connected between the cooling device and the inlet of the pumping apparatus, a fourth pipeline is connected between the storage tank and the inlet of the pumping apparatus, and the first pipeline, the second pipeline, the third pipeline, and the fourth pipeline can all selectively be conducting or be closed.

In embodiments, when the diversion system is operating, one of the first or the second pipelines is conducting, and one of the third or the fourth pipelines is conducting; and the pumping apparatus extracts the cooling medium by means of one of the third or the fourth pipelines that is conducting, and then conveys the cooling medium externally by means of one of the first or the second pipelines that is conducting.

Further, in embodiments, the diversion system comprises a first operating mode and a second operating mode. When the diversion system is in the first operating mode, the first pipeline and the fourth pipeline are conducting, and the second pipeline and the third pipeline are closed; and the pumping apparatus extracts the cooling medium from the storage tank by means of the fourth pipeline, and then conveys the cooling medium into the cooling device by means of the first pipeline.

In embodiments, when the diversion system is in the second operating mode, the second pipeline and the third pipeline are conducting, and the first pipeline and the fourth pipeline are closed; and the pumping apparatus extracts the cooling medium from the cooling device by means of the third pipeline, and then conveys the cooling medium into the storage tank by means of the second pipeline.

In embodiments, the diversion system further includes a controller for controlling conducting or closing of the first pipeline, the second pipeline, the third pipeline, and the fourth pipeline, and a measuring meter for detecting a volume of the cooling medium in the cooling device, the measuring meter in communicative connection to the controller.

In embodiments, when the measuring meter detects the volume of the cooling medium in the cooling device is less than a first volume, the controller controls the first pipeline and the fourth pipeline to be conducting and the second pipeline and the third pipeline to be closed, so as to switch the diversion system to the first operating mode.

In embodiments, when the measuring meter detects the volume of the cooling medium in the cooling device exceeds a second volume, the controller controls the second pipeline and the third pipeline to be conducting and the first pipeline and the fourth pipeline to be closed, so as to switch the diversion system to the second operating mode, wherein the second volume is greater than the first volume.

In embodiments, the diversion system further comprises a first filter provided in communication with the second pipeline or the fourth pipeline.

In embodiments, the diversion system includes a third operating mode, wherein when the diversion system is in the third operating mode, the second pipeline and the fourth pipeline are conducting, and the first pipeline and the third pipeline are closed; the pumping apparatus extracts the cooling medium from the storage tank by means of the fourth pipeline, and then conveys the cooling medium back to the storage tank by means of the second pipeline; and the first filter filters the cooling medium flowing therethrough.

In embodiments, the first filter is disposed in the storage tank.

In embodiments, the diversion system further comprises a controller for controlling conducting or closing of the first pipeline, the second pipeline, the third pipeline, and the fourth pipeline, and a first detector for detecting purity of the cooling medium in the storage tank, the first detector in communicative connection to the controller.

In embodiments, when the first detector detects the purity of the cooling medium in the storage tank is less than a preset value, the controller controls the second pipeline and the fourth pipeline to be conducting and the first pipeline and the third pipeline to be closed, so as to switch the diversion system to the third operating mode.

In embodiments, the diversion system further comprises a second filter provided in communication with the first pipeline or the third pipeline.

In embodiments, the diversion system comprises a fourth operating mode, wherein when the diversion system is in the fourth operating mode, the first pipeline and the third pipeline are conducting, and the second pipeline and the fourth pipeline are closed; the pumping apparatus extracts the cooling medium from the cooling device by means of the third pipeline, and then conveys the cooling medium back to the cooling device by means of the first pipeline; and the second filter filters the cooling medium flowing therethrough.

In embodiments, the diversion system further comprises a controller for controlling conducting or closing of the first pipeline, the second pipeline, the third pipeline, and the fourth pipeline, and a second detector for detecting purity of the cooling medium in the cooling device, the second detector in communicative connection to the controller.

In embodiments, when the second detector detects the purity of the cooling medium in the cooling device is less than a preset value, the controller controls the first pipeline and the third pipeline to be conducting and the second pipeline and the fourth pipeline to be closed, so as to switch the diversion system to the fourth operating mode.

Further, in embodiments, the first pipeline, the second pipeline, the third pipeline, and the fourth pipeline are all provided with a valve; and the valve can be opened or closed so that a corresponding pipeline in the first pipeline, the second pipeline, the third pipeline, and the fourth pipeline can be conducting or closed.

Further, in embodiments, the first pipeline and the second pipeline are connected to a first common pipeline by means of a three-way connector, and both the first pipeline and the second pipeline are connected to the outlet of the pumping apparatus by means of the first common pipeline.

Further, in embodiments, the third pipeline and the fourth pipeline are connected to a second common pipeline by means of a three-way connector, and both the third pipeline and the fourth pipeline are connected to the inlet of the pumping apparatus by means of the second common pipeline.

Further, the first pipeline and the third pipeline are connected to a third common pipeline by means of a three-way connector, and both the first pipeline and the third pipeline are connected to the cooling device by means of the third common pipeline.

In another embodiment, the present invention provides for a diversion system applicable to a cooling device, the system comprising: a storage tank and a pumping apparatus, the storage tank used for storing a cooling medium, and the pumping apparatus comprising an inlet and an outlet.

In embodiments, a first pipeline is connected between the cooling device and the outlet of the pumping apparatus, a second pipeline is connected between the storage tank and the outlet of the pumping apparatus, a third pipeline is connected between the cooling device and the inlet of the pumping apparatus, a fourth pipeline is connected between the storage tank and the inlet of the pumping apparatus, and the first pipeline, the second pipeline, the third pipeline, and the fourth pipeline can all selectively be conducting or be closed.

In embodiments, when the diversion system is operating, at least two of the first pipeline, the second pipeline, the third pipeline, and the fourth pipeline are conducting.

In another embodiment of the present invention provides for a cooling system, wherein the cooling system comprises a first storage tank, a second storage tank, and a pumping apparatus, the first storage tank and the second storage tank are used for storing a cooling medium, the first storage tank is in communication with the second storage tank by means of the pumping apparatus, and the cooling system is configured to operate in a first mode and a second mode.

In the first mode, in embodiments, the cooling medium in the first storage tank is introduced into the second storage tank by means of the pumping apparatus; in the second mode, the cooling medium in the second storage tank is introduced into the first storage tank by means of the pumping apparatus; and in the first mode and the second mode, directions of the cooling medium flowing through the pumping apparatus are the same.

As can be seen from the above technical solutions, in embodiments of the diversion system of the present invention, one of the first or the second pipelines is conducting, and one of the third or the fourth pipelines is conducting, thereby forming a plurality of circulation paths of different flow directions for the cooling medium to circulate, in which case only one pumping apparatus is required for achieving both conveying of the cooling medium in the cooling device into the storage tank for recovery and conveying of the cooling medium in the storage tank into the cooling device for replenishment, so that the diversion system has various functions, greatly reduces maintenance costs of the cooling device, and improves maintenance efficiency.

DETAILED DESCRIPTION

Figure 1:
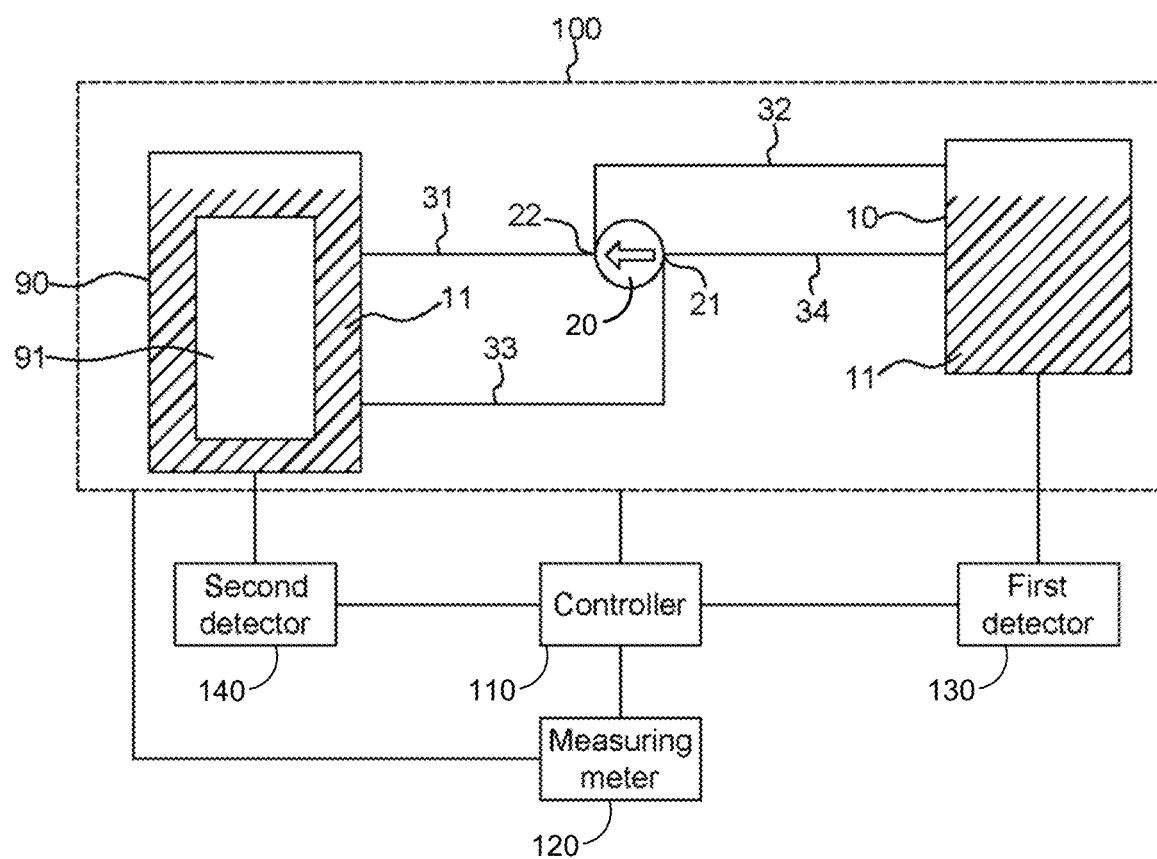
FIG. 1 illustrates a schematic structural diagram of a diversion system according to an exemplary embodiment of the present invention.

Eemplary embodiments are described in detail herein, examples of which are shown in the drawings. The following description relates to the drawings, unless otherwise indicated, the same number in different drawings represents the same or similar element. The implementations described in the following exemplary embodiments do not represent all the implementations consistent with the present invention. Rather, they are merely examples of devices and methods consistent with some aspects of the present invention, as detailed in the appended claims.

The terminologies used in the present invention are for the purpose of describing particular embodiments only and are not intended to limit the present invention. As used in the present application and in the appended claims, the singular forms "a/an", "said", and "the" are also intended to include the case of plural forms, unless the context clearly indicates other meanings. It should also be understood that the term "and/or" used herein refers to and includes any or all possible combinations of one or a plurality of associated listed items.

It should be understood that although terms first, second, third, etc. may be used to describe various kinds of information. These kinds of information should not be limited to these terms. These terms are used only to distinguish one piece of information from one another of the same type. For example, without departing from the scope of the present invention, first information may also be referred to as second information, and similarly, second information may also be referred to as first information. Depending on the context, the word "if" as used herein can be interpreted as "at the time" or "when" or "in response to the determination".

The purpose of the present invention is to provide a diversion system applicable to a cooling device, so that replenishment and recovery of a cooling medium in the cooling device can be implemented by means of only one pumping apparatus. The cooling device of the present invention is described in detail below with reference to the drawings. When no conflicts exist, the features of the following embodiments and implementations can be combined with each other.

Please refer to FIG. 1. Embodiments of the present invention provide a diversion system 100 applicable to a cooling device. The diversion system 100 includes: a storage tank 10 and a pumping apparatus 20, the storage tank used for storing a cooling medium 11, and the pumping apparatus 20 including an inlet 21 and an outlet 22. Optionally, a pump may be adopted as the pumping apparatus 20.

The cooling device 90 may be filled with the cooling medium 11, a to-be-cooled apparatus 91 is at least partially immersed in the cooling medium 11, and heat dissipation is performed for the to-be-cooled apparatus 91 by means of the cooling medium 11. The to-be-cooled apparatus 91 may be a server of a data center, or may be other heat-producing devices that need to be cooled. The cooling medium 11 may be a gaseous medium, a liquid medium, or a solid-liquid mixed medium capable of being configured according to actual needs. In the example shown by the present invention, the to-be-cooled apparatus 91 is completely immersed in the cooling medium 11, and the cooling medium 11 is an electronic fluorinated liquid.

A first pipeline 31 is connected between the cooling device 90 and the outlet 22 of the pumping apparatus 20, a second pipeline 32 is connected between the storage tank 10 and the outlet 22 of the pumping apparatus 20, a third pipeline 33 is connected between the cooling device 90 and the inlet 21 of the pumping apparatus 20, a fourth pipeline 34 is connected between the storage tank 10 and the inlet 21 of the pumping apparatus 20, and the first pipeline 31, the second pipeline 32, the third pipeline 33, and the fourth pipeline 34 can all selectively be conducting or be closed.

It can be understood that the pumping apparatus 20 may be provided with two outlets 22 connected to the first pipeline 31 and the second pipeline 32 in a one-to-one correspondence. The pumping apparatus 20 may be provided with two inlets 21 connected to the third pipeline 33 and the fourth pipeline 34 in a one-to-one correspondence. Similarly, the storage tank 10 and the cooling device 90 may be respectively provided with two connection ports for connecting to the corresponding first pipeline 31, second pipeline 32, third pipeline 33, and fourth pipeline 34.

When the diversion system 100 is operating, one of the first pipeline 31 or the second pipeline 32 is conducting, and one of the third pipeline 33 or the fourth pipeline 34 is conducting. The pumping apparatus 20 extracts the cooling medium 11 by means of the third pipeline 33 or the fourth pipeline 34 that is conducting, and then conveys the cooling medium 11 externally by means of the first pipeline 31 or the second pipeline 32 that is conducting.

As can be understood from the above technical solutions, in the diversion system 100 of the present invention, one of the first pipeline 31 or the second pipeline 32 is conducting, and one of the third pipeline 33 or the fourth pipeline 34 is conducting, thereby forming a plurality of circulation paths of different flow directions for the cooling medium 11 to circulate, in which case only one pumping apparatus 20 is required for achieving both conveying of the cooling medium 11 in the cooling device 90 into the storage tank 10 for recovery and conveying of the cooling medium 11 in the storage tank 10 into the cooling device 90 for replenishment, so that the diversion system 100 has various functions, greatly reduces maintenance costs of the cooling device 90, and improves maintenance efficiency.

Figure 2:
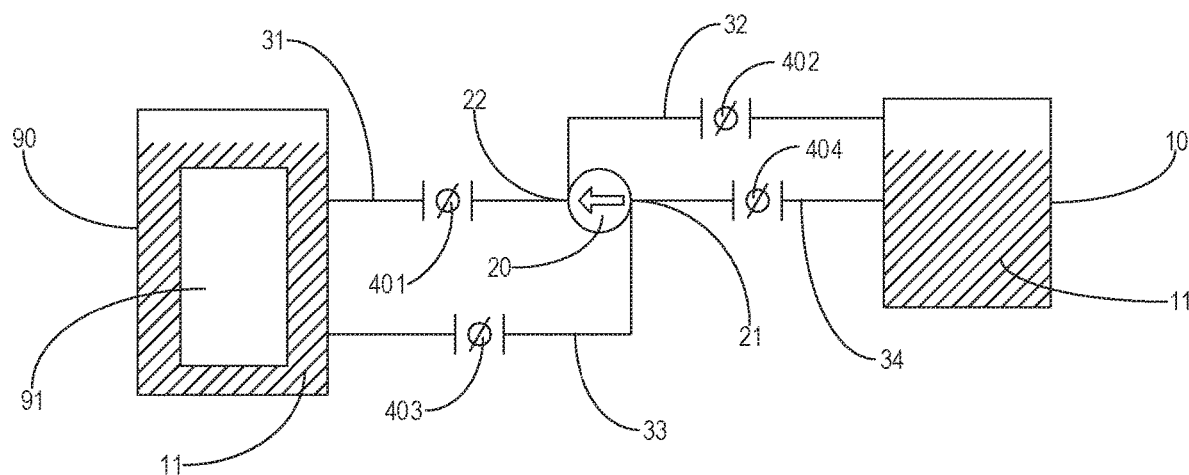
FIG. 2 illustrates another schematic structural diagram of the diversion system according to an exemplary embodiment of the present invention.

Referring to FIG. 2, in an implementation, the first pipeline 31, the second pipeline 32, the third pipeline 33, and the fourth pipeline 34 are all provided with a valve; and conducting or closing of the first pipeline 31, the second pipeline 32, the third pipeline 33, and the fourth pipeline 34 is implemented by opening or closing a corresponding valve. It can be understood that in the example shown in FIG. 2, the first pipeline 31 is provided with a first valve 401, the second pipeline 32 is provided with a second valve 402, the third pipeline 33 is provided a third valve 403, the fourth pipeline 34 is provided with a fourth valve 404. The conducting or closing of the first pipeline 31 is implemented by opening or closing the first valve 401. The conducting or closing of the second pipeline 32 is implemented by opening or closing the second valve 402. The conducting or closing of the third pipeline 33 is implemented by opening or closing the third valve 403. The conducting or closing of the fourth pipeline 34 is implemented by opening or closing the fourth valve 404. Certainly, the conducting or closing of the first pipeline 31, the second pipeline 32, the third pipeline 33, and the fourth pipeline 34 can also be implemented in other manners, which are not limited to the manner of valves described in the present application.

In an implementation, the diversion system 100 includes a first operating mode and a second operating mode.

Figure 3:
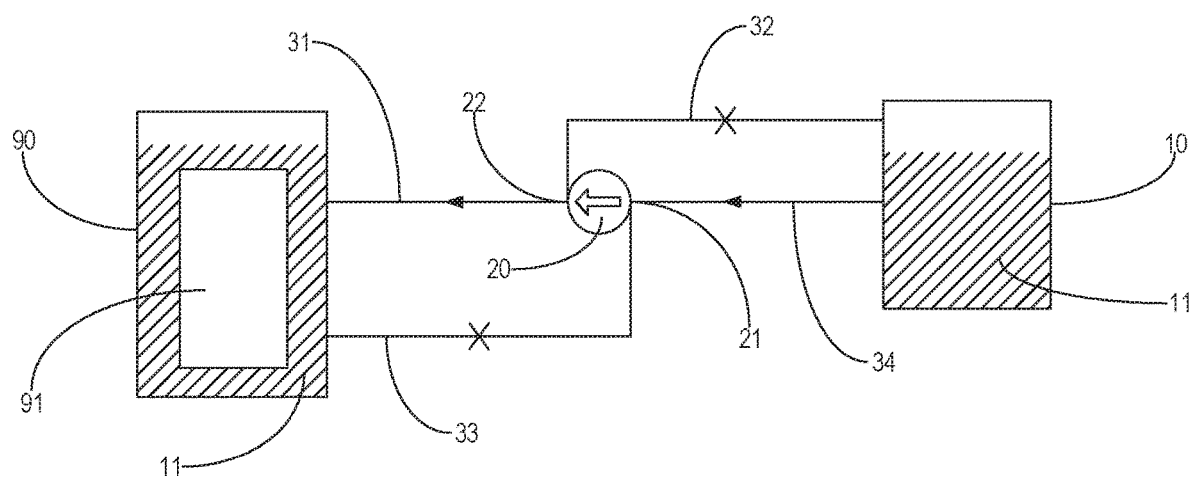
FIG. 3 illustrates a schematic structural diagram of the diversion system in a first operating mode according to an exemplary embodiment of the present invention.

Referring to FIG. 3, when the volume of the cooling medium 11 in the cooling device 90 is insufficient to satisfy the requirements of heat dissipation, the diversion system 100 may switch to the first operating mode. When the diversion system 100 is in the first operating mode, the first pipeline 31 and the fourth pipeline 34 are conducting, and the second pipeline 32 and the third pipeline 33 are closed. The pumping apparatus 20 extracts the cooling medium 11 from the storage tank 10 by means of the fourth pipeline 34, and then conveys the cooling medium 11 into the cooling device 90 by means of the first pipeline 31. The flow direction of the cooling medium 11 is as shown by the arrow in FIG. 3, thereby implementing replenishment of the cooling medium 11 in the cooling device 90. That is, the first operating mode of the diversion system 100 can be interpreted as replenishing the cooling device 90 with the cooling medium.

Figure 4:
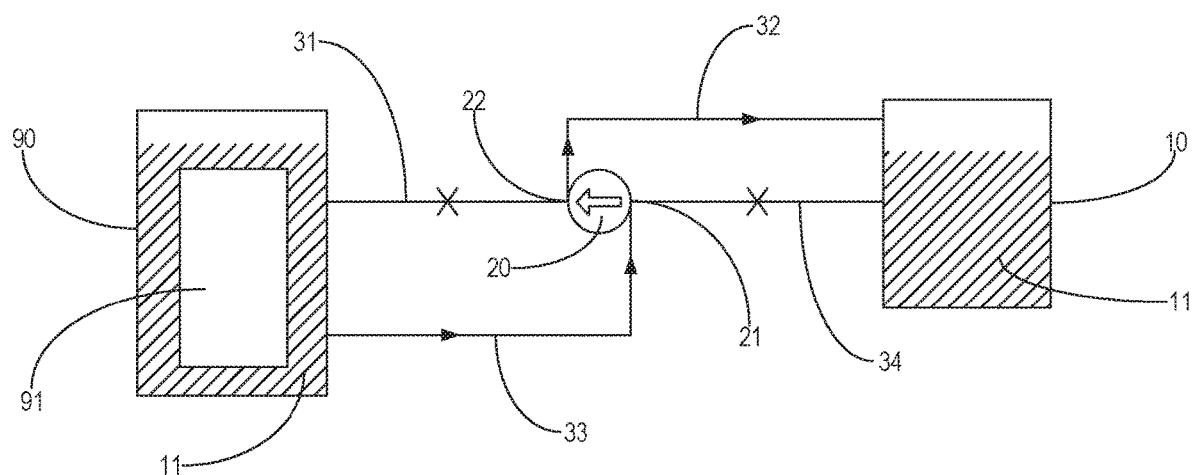
FIG. 4 illustrates a schematic structural diagram of the diversion system in a second operating mode according to an exemplary embodiment of the present invention.

Please refer to FIG. 4. When the volume of the cooling medium 11 in the cooling device 90 is excessive and overflowing may occur, the diversion system 100 may switch to the second operating mode. When the diversion system 100 is in the second operating mode, the second pipeline 32 and the third pipeline 33 are conducting, and the first pipeline 31 and the fourth pipeline 34 are closed. The pumping apparatus 20 extracts the cooling medium 11 from the cooling device 90 by means of the third pipeline 33, and then conveys the cooling medium 11 into the storage tank 10 by means of the second pipeline 32. The flow direction of the cooling medium 11 is as shown by the arrow in FIG. 4, thereby implementing recovery of the cooling medium 11 in the cooling device 90. That is, the second operating mode of the diversion system 100 can be interpreted as recovering the cooling medium in the cooling device 90.

Figure 5:
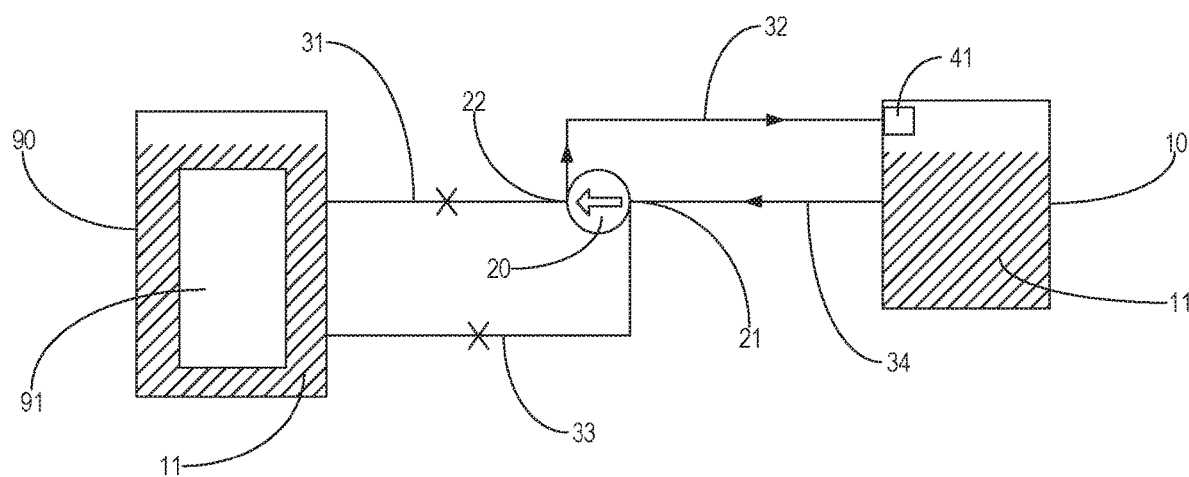
FIG. 5 illustrates a schematic structural diagram of the diversion system in a third operating mode according to an exemplary embodiment of the present invention.

Please refer to FIG. 5. In an implementation, the diversion system 100 further includes a first filter 41 provided in communication with the second pipeline 32 or the fourth pipeline 34. The first filter 41 can be mounted outside or inside the storage tank 10. Further, when the first filter 41 is disposed outside the storage tank 10, it may be mounted in the second pipeline 32 or the fourth pipeline 34. In the example shown in FIG. 5, the first filter 41 is disposed inside the storage tank 10.

The diversion system 100 further includes a third operating mode. When purity of the cooling medium 11 in the storage tank 10 cannot satisfy the requirements, the diversion system 100 can switch to the third operating mode. When the diversion system 100 is in the third operating mode, the second pipeline 32 and the fourth pipeline 34 are conducting, and the first pipeline 31 and the third pipeline 33 are closed. The pumping apparatus 20 extracts the cooling medium 11 from the storage tank 10 by means of the fourth pipeline 34, and then conveys the cooling medium 11 back to the storage tank 10 by means of the second pipeline 32. The first filter 41 can filter the cooling medium 11 flowing therethrough, and the flow direction of the cooling medium 11 is as shown by the arrow in FIG. 5, thereby implementing circulating filtration of the cooling medium 11 in the storage tank 10. That is, the third operating mode of the diversion system 100 can be interpreted as filtering the cooling medium 11 in the storage tank 10.

Figure 6:
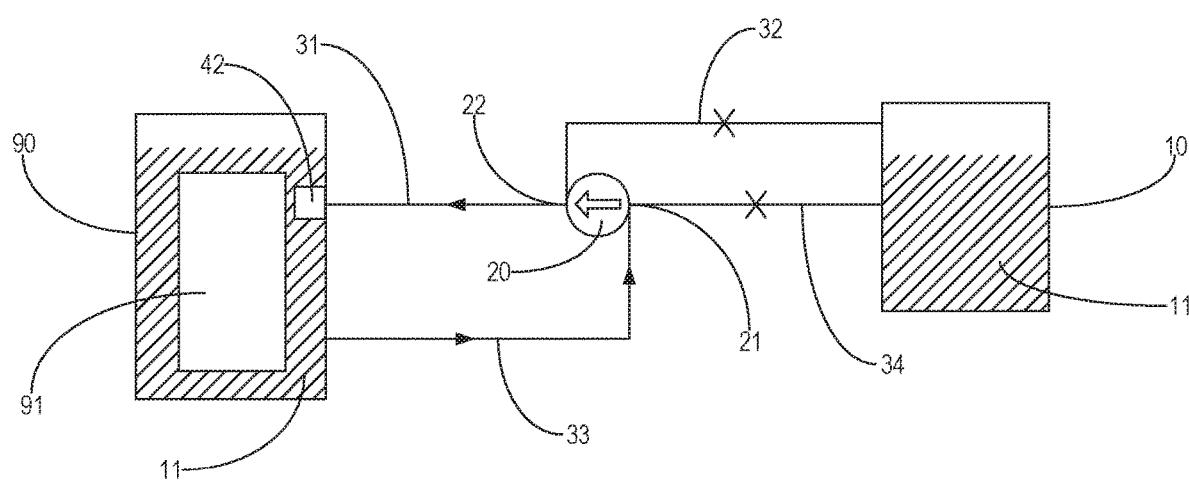
FIG. 6 illustrates a schematic structural diagram of the diversion system in a fourth operating mode according to an exemplary embodiment of the present invention.

Please refer to FIG. 6. In an implementation, the diversion system 100 further includes a second filter 42 provided in communication with the first pipeline 31 or the third pipeline 33. The second filter 42 can be mounted outside or inside the cooling device 90. Further, when the second filter 42 is disposed outside the cooling device 90, it may be mounted in the first pipeline 31 or the third pipeline 33. In the example shown in FIG. 6, the second filter 42 is disposed inside the cooling device 90.

The diversion system 100 further includes a fourth operating mode. When purity of the cooling medium 11 in the cooling device 90 cannot satisfy the requirements, the diversion system 100 can switch to the fourth operating mode. When the diversion system 100 is in the fourth operating mode, the first pipeline 31 and the third pipeline 33 are conducting, and the second pipeline 32 and the fourth pipeline 34 are closed. The pumping apparatus 20 extracts the cooling medium 11 from the cooling device 90 by means of the third pipeline 33, and then conveys the cooling medium 11 back to the cooling device 90 by means of the first pipeline 31. The second filter 42 can circulating-filter the cooling medium 11 flowing therethrough, and the flow direction of the cooling medium 11 is as shown by the arrow in FIG. 6, thereby implementing filtration of the cooling medium 11 in the cooling device 90. That is, the fourth operating mode of the diversion system 100 can be interpreted as filtering the cooling medium 11 in the cooling device 90.

In an implementation, the diversion system 100 further includes a controller 110 for controlling the conducting or closing of the first pipeline 31, the second pipeline 32, the third pipeline 33, and the fourth pipeline 34, and a measuring meter 120 for detecting the volume of the cooling medium 11 in the cooling device 90, the measuring meter 120 in communicative connection to the controller 110. It can be understood that the valve may be a solenoid valve, and the controller can control opening or closing of the valves corresponding to the first pipeline 31, the second pipeline 32, the third pipeline 33, and the fourth pipeline 34, so as to implement the conducting or closing of the first pipeline 31, the second pipeline 32, the third pipeline 33, and the fourth pipeline 34.

When the measuring meter detects the volume of the cooling medium 11 in the cooling device 90 is less than a first volume, the controller controls the valves corresponding to the first pipeline 31 and the fourth pipeline 34 to open such that the first pipeline 31 and the fourth pipeline 34 are conducting, and controls the valves corresponding to the second pipeline 32 and the third pipeline 33 to close such that the second pipeline 32 and the third pipeline 33 are closed, thereby switching the diversion system 100 to the first operating mode and implementing replenishment of the cooling medium 11 in the cooling device 90.

When the measuring meter detects the volume of the cooling medium 11 in the cooling device 90 exceeds a second volume, the controller controls the valves corresponding to the second pipeline 32 and the third pipeline 33 to open such that the second pipeline 32 and the third pipeline 33 are conducting, and controls the valves corresponding to the first pipeline 31 and the fourth pipeline 34 to close such that the first pipeline 31 and the fourth pipeline 34 are closed, thereby switching the diversion system 100 to the second operating mode and implementing recovery of the cooling medium 11 in the cooling device 90. The second volume is greater than the first volume. The first volume can be interpreted as the minimum volume allowed for the cooling medium 11 in the cooling device 90. The second volume can be interpreted as the maximum volume allowed for the cooling medium 11 in the cooling device 90.

In an implementation, the diversion system 100 further includes a first detector 130 for detecting purity of the cooling medium 11 in the storage tank 10, the first detector in communicative connection to the controller and capable of being mounted in the storage tank 10.

When the first detector detects the purity of the cooling medium 11 in the storage tank 10 is less than a preset value, the controller controls the valves corresponding to the second pipeline 32 and the fourth pipeline 34 to open such that the second pipeline 32 and the fourth pipeline 34 are conducting, and controls the valves corresponding to the first pipeline 31 and the third pipeline 33 to close such that the first pipeline 31 and the third pipeline 33 are closed, thereby switching the diversion system 100 to the third operating mode and implementing filtration of the cooling medium 11 in the storage tank 10.

In an implementation, the diversion system 100 further includes a second detector 140 for detecting the purity of the cooling medium 11 in the cooling device 90, the second detector in communicative connection to the controller and capable of being mounted in the cooling device 90.

When the second detector detects the purity of the cooling medium 11 in the cooling device 90 is less than a preset value, the controller controls the valves corresponding to the first pipeline 31 and the third pipeline 33 to open such that the first pipeline 31 and the third pipeline 33 are conducting, and controls the valves corresponding to the second pipeline 32 and the fourth pipeline 34 to close such that the second pipeline 32 and the fourth pipeline 34 are closed, thereby switching the diversion system 100 to the fourth operating mode and implementing filtration of the cooling medium 11 in the cooling device 90.

Therefore, functions of automatic cooling medium replenishment and recovery for the cooling device 90 can be implemented by configuring the controller and the measuring meter. The function of automatic cooling medium filtration for the storage tank 10 and the cooling device 90 can be implemented by configuring the first detector and the second detector.

Figure 7:
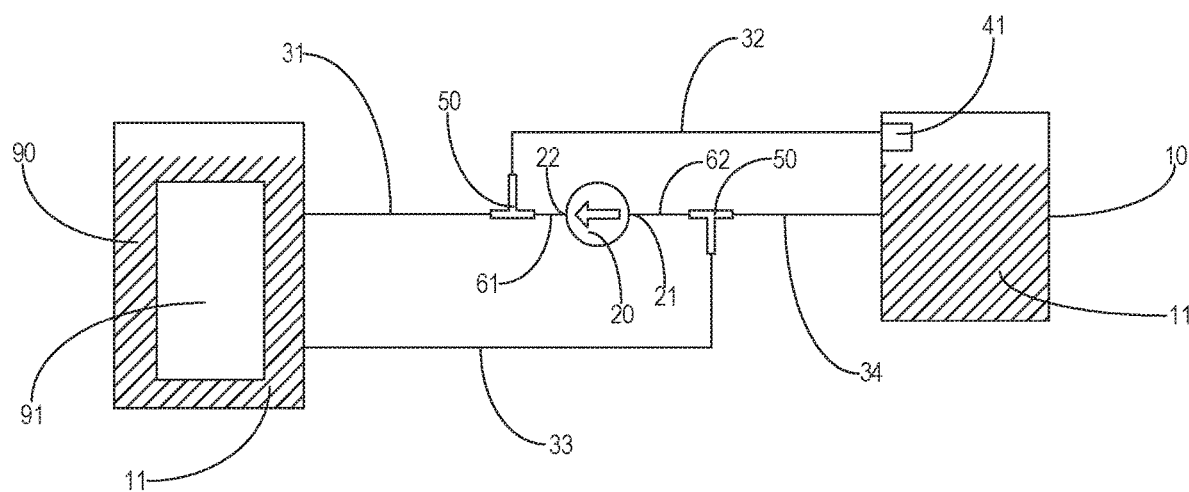
FIG. 7 illustrates yet another schematic structural diagram of the diversion system according to an exemplary embodiment of the present invention.

Please refer to FIG. 7. In an implementation, the first pipeline 31 and the second pipeline 32 can be connected to a first common pipeline 61 by means of a three-way connector 50, and both the first pipeline 31 and the second pipeline 32 are connected to the outlet 22 of the pumping apparatus 20 by means of the first common pipeline 61. The third pipeline 33 and the fourth pipeline 34 are connected to a second common pipeline 62 by means of a three-way connector 50, and both the third pipeline 33 and the fourth pipeline 34 are connected to the inlet 21 of the pumping apparatus 20 by means of the second common pipeline 62. Through the configuration of the three-way connector 50, the first common pipeline 61 can be shared by the first pipeline 31 and the second pipeline 32, and the second common pipeline 62 can be shared by the third pipeline 33 and the fourth pipeline 34. In this way, the pumping apparatus 20 only needs to be provided with one inlet 21 and one outlet 22, and only needs to be connected to the two pipelines of the first common pipeline 61 and the second common pipeline 62, thereby simplifying the device structure and reducing the cost.

Figure 8:
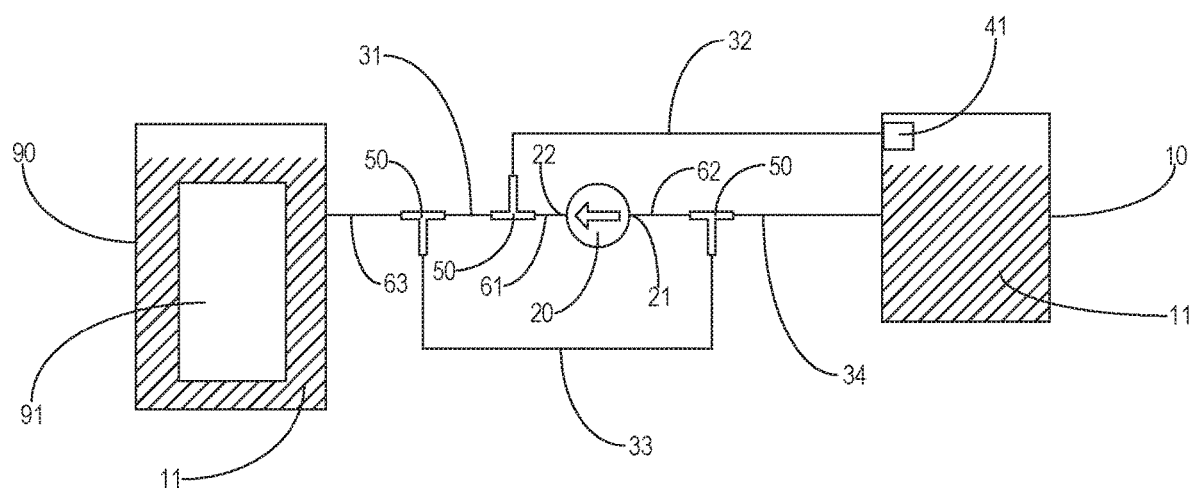
FIG. 8 illustrates yet another schematic structural diagram of the diversion system according to an exemplary embodiment of the present invention.

Please refer to FIG. 8. Without considering the function of filtering the cooling medium 11 in the cooling device 90, the first pipeline 31 and the third pipeline 33 can be connected to a third common pipeline 63 by means of a three-way connector 50, and both the first pipeline 31 and the third pipeline 33 are connected to the cooling device 90 by means of the third common pipeline 63. In this way, the cooling device 90 only needs to be provided with one connection port for connecting to the third common pipeline 63, thereby saving perforation costs.

Figure 9:
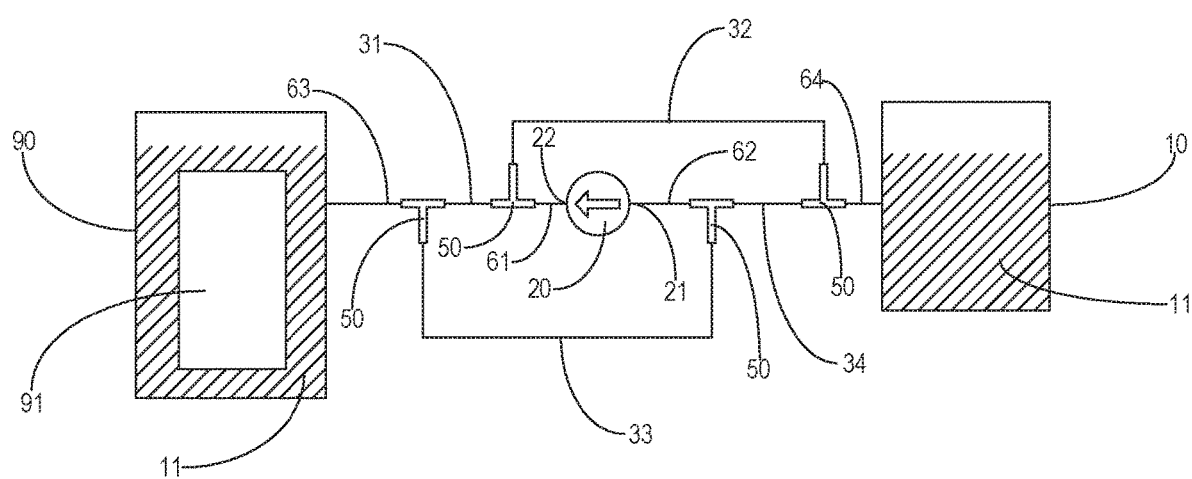
FIG. 9 illustrates yet another schematic structural diagram of the diversion system according to an exemplary embodiment of the present invention.

Further, referring to FIG. 9, without considering the function of filtering the cooling medium 11 in the storage tank 10, the third pipeline 33 and the fourth pipeline 34 can be connected to a fourth common pipeline 64 by means of a three-way connector 50, and both the third pipeline 33 and the fourth pipeline 34 are connected to the storage tank 10 by means of the fourth common pipeline 64. In this way, the storage tank 10 only needs to be provided with one connection port for connecting to the fourth common pipeline 64, thereby saving perforation costs. Certainly, the number and arrangement of the three-way connectors and the common pipelines can be appropriately changed according to actual needs, which are not limited in the present application.

In conclusion, in the diversion system 100 of the present invention, one of the first pipeline 31 or the second pipeline 32 is configured to be conducting, and one of the third pipeline 33 or the fourth pipeline 34 is configured to be conducting, thereby forming a plurality of circulation paths of different flow directions for the cooling medium 11 to circulate, in which case only one pumping apparatus 20 is required for achieving various functions such as cooling medium replenishment for the cooling device 90, cooling medium recovery for the cooling device 90, filtration of the cooling medium 11 in the cooling device 90, and filtration of the cooling medium 11 in the storage tank 10, greatly reducing maintenance costs of the cooling device 90 and improving maintenance efficiency.

Figure 10:
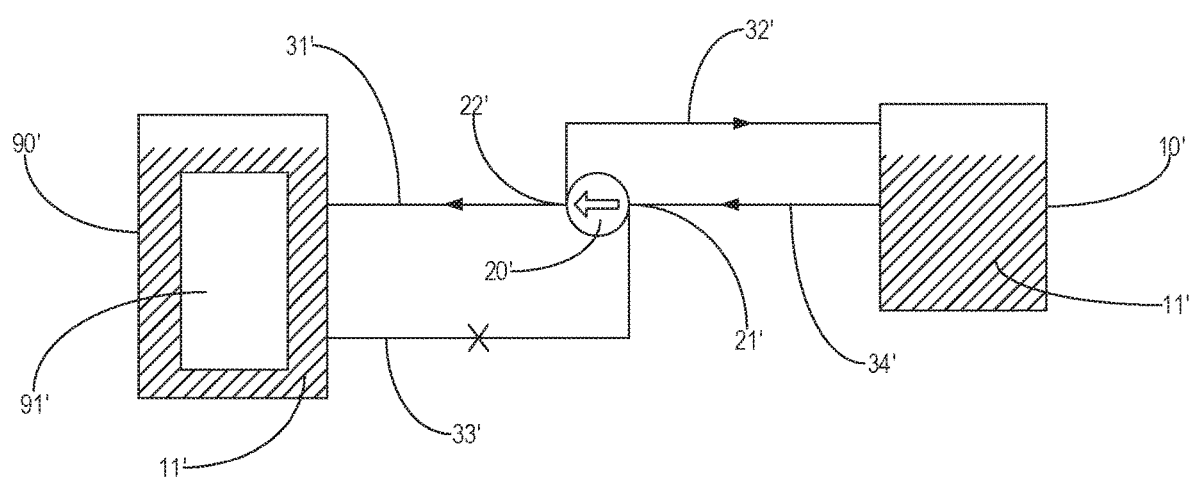
FIG. 10 illustrates yet another schematic structural diagram of the diversion system according to an exemplary embodiment of the present invention.

Please refer to FIGS. 9 and 10. Embodiments of the present invention further provide for a diversion system applicable to a cooling device, including: a storage tank 10' and a pumping apparatus 20', the storage tank 10' used for storing a cooling medium 11', and the pumping apparatus 20' including an inlet 21' and an outlet 22'. A first pipeline 31' is connected between the cooling device 90' and the outlet 22' of the pumping apparatus 20', a second pipeline 32' is connected between the storage tank 10' and the outlet 22' of the pumping apparatus 20', a third pipeline 33' is connected between the cooling device 90' and the inlet 21' of the pumping apparatus 20', a fourth pipeline 34' is connected between the storage tank 10' and the inlet 21' of the pumping apparatus 20', and the first pipeline 31', the second pipeline 32', the third pipeline 33', and the fourth pipeline 34' can all selectively be conducting or be closed. When the diversion system is operating, at least two of the first pipeline 31', the second pipeline 32', the third pipeline 33', and the fourth pipeline 34' are conducting.

As shown in FIG. 10, when the first pipeline 31', the second pipeline 32', and the fourth pipeline 34' are conducting, the pumping apparatus 20' can convey the cooling medium 11' in the storage tank 10' into the cooling device 90' by means of the first pipeline 31' and the fourth pipeline 34', so as to implement cooling medium replenishment for the cooling device 90'. The pumping apparatus 20' can also circulate and convey the cooling medium 11' in the storage tank 10' back into the storage tank 10' by means of the second pipeline 32' and the fourth pipeline 34', and a filtration apparatus may be disposed in any one of the second pipeline 32' and the fourth pipeline 34', so as to implement filtration of the cooling medium 11' in the storage tank 10'.

Figure 11:
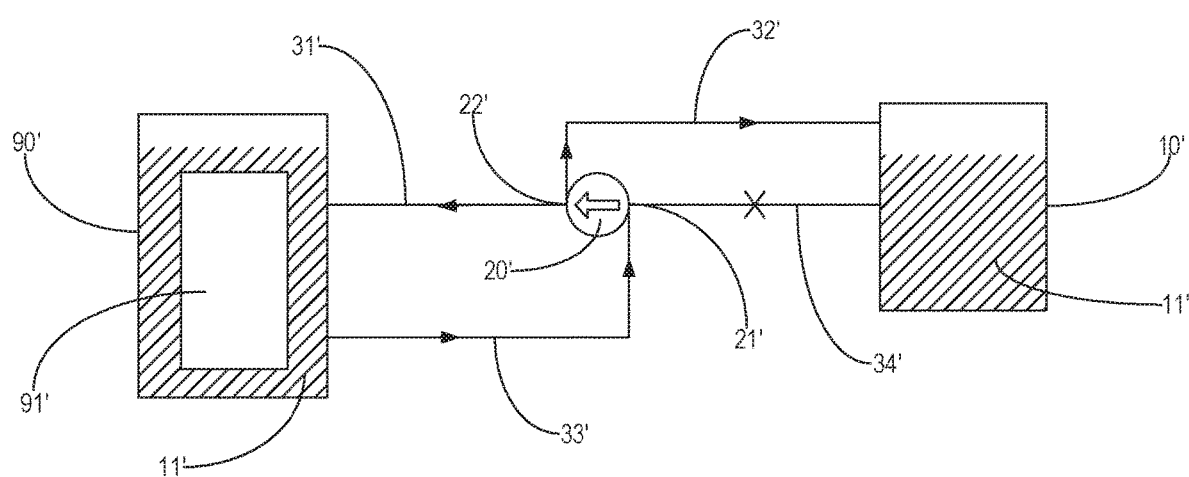
FIG. 11 illustrates yet another schematic structural diagram of the diversion system according to an exemplary embodiment of the present invention.

As shown in FIG. 11, when the first pipeline 31', the second pipeline 32', and the third pipeline 33' are conducting, the pumping apparatus 20' can convey the cooling medium 11' in the cooling device 90' into the storage tank 10' by means of the second pipeline 32' and the third pipeline 33', so as to implement cooling medium recovery for the cooling device 90'. The pumping apparatus 20' can also circulating-convey the cooling medium 11' in the cooling device 90' back into the cooling device 90' by means of the first pipeline 31' and the third pipeline 33', and a filtration apparatus may be disposed in either of the first pipeline 31' and the third pipeline 33', so as to implement filtration of the cooling medium 11' in the cooling device 90'.

In embodiments of the diversion system of the present invention, the first pipeline 31', the second pipeline 32', the third pipeline 33', and the fourth pipeline 34' can form a plurality of circulation paths of different flow directions for the cooling medium 11' to circulate, in which case only one pumping apparatus 20' is required for achieving both conveying of the cooling medium 11' in the storage tank 10' into the cooling device 90' for replenishment and conveying of the cooling medium 11' in the cooling device 90' into the storage tank 10' for recovery, as well as filtration of the cooling medium 11' in the storage tank 10' and the cooling device 90', so that the diversion system has various functions, greatly reduces device maintenance costs, and improves maintenance efficiency.

Embodiments of the present invention further provide for a cooling system, wherein the cooling system includes a first storage tank, a second storage tank (cooling device (90)), and a pumping apparatus, the first storage tank and the second storage tank are used for storing a cooling medium, the first storage tank is in communication with the second storage tank by means of the pumping apparatus, and the cooling system is configured to operate in a first mode and a second mode. When the cooling system is in the first mode, the cooling medium in the first storage tank is introduced into the second storage tank by means of the pumping apparatus. When the cooling system is in the second mode, the cooling medium in the second storage tank is introduced into the first storage tank by means of the pumping apparatus. In the first mode and the second mode, directions of the cooling medium flowing through the pumping apparatus are the same.

In this way, only one pumping apparatus is required for implementing circulation of the cooling medium between the two storage tanks, without the need for an extra pumping apparatus, thereby greatly reducing device costs. It should be noted that a connection manner between the first storage tank, the second storage tank, and the pumping apparatus can be the same as a connection manner between the storage tank, the cooling device, and the pumping apparatus of the diversion system as described in the above embodiments and implementations.

Other embodiments of the present invention will be readily conceivable by those skilled in the art after considering the invention disclosed in the specification and practicing herein. The present application is intended to cover any variations, uses, or adaptations of the present invention, and the variations, uses, or adaptations are governed by the general principles of the present invention and include commonly known knowledge or conventional technical means in the art that are not disclosed in the present application. The specification and embodiments are considered illustrative only and the actual scope and spirit of the present invention are indicated by the appended claims.

It should be noted that the term "include," "comprise," or any other variation thereof is intended to encompass a non-exclusive inclusion, so that a process, method, commodity, or device that includes a series of elements includes not only those elements but also other elements not explicitly listed, or elements that are inherent to such a process, method, commodity, or device. The element defined by the statement "including one . . . ," without further limitation, does not preclude the presence of additional identical elements in the process, method, commodity, or device that includes the element.

The above description is merely preferred embodiments of the present invention and is not intended to limit the present invention. Any modifications, equivalent substitutions, improvements, and etc. made within the spirit and principles of the present invention should be included within the scope of protection of the present claims.

The invention claimed is:

1. A diversion system, comprising:
  a storage tank and a pumping apparatus, the storage tank for storing a cooling medium, and the pumping apparatus comprising an inlet and an outlet, wherein
  a first pipeline is coupled between a cooling device and the outlet of the pumping apparatus, a second pipeline is coupled between the storage tank and the outlet of the pumping apparatus, a third pipeline is coupled between the cooling device and the inlet of the pumping apparatus, a fourth pipeline is coupled between the storage tank and the inlet of the pumping apparatus, and the first pipeline, the second pipeline, the third pipeline, and the fourth pipeline configured selectively to be conducting or be closed; and wherein:
  when the diversion system is operating, one of the first or the second pipelines is conducting, and one of the third or the fourth pipelines is conducting; and
  the pumping apparatus extracts the cooling medium by one of the third or the fourth pipelines that is conducting, and conveys the cooling medium externally by one of the first or the second pipelines that is conducting.

2. The diversion system according to claim 1, configured into one of a first operating mode and a second operating mode; wherein
  when the diversion system is in the first operating mode, the first pipeline and the fourth pipeline are conducting, and the second pipeline and the third pipeline are closed;
  the pumping apparatus extracts cooling medium from the storage tank by the fourth pipeline, and conveys the cooling medium into the cooling device by the first pipeline; and
  when the diversion system is in the second operating mode, the second pipeline and the third pipeline are conducting, and the first pipeline and the fourth pipeline are closed; and the pumping apparatus extracts the cooling medium from the cooling device by the third pipeline, and conveys the cooling medium into the storage tank by the second pipeline.

3. The diversion system according to claim 2, further comprising a controller for controlling conducting or closing of the first pipeline, the second pipeline, the third pipeline, and the fourth pipeline, and a measuring meter for detecting a volume of the cooling medium in the cooling device, the measuring meter in communicative connection to the controller; wherein
  when the measuring meter detects the volume of the cooling medium in the cooling device is less than a first volume, the controller controls the first pipeline and the fourth pipeline to be conducting and the second pipeline and the third pipeline to be closed, so as to switch the diversion system to the first operating mode, and
  when the measuring meter detects the volume of the cooling medium in the cooling device exceeds a second volume, the controller controls the second pipeline and the third pipeline to be conducting and the first pipeline and the fourth pipeline to be closed, so as to switch the diversion system to the second operating mode, wherein the second volume is greater than the first volume.

4. The diversion system according to claim 1, further comprising a first filter in communication with the second pipeline or the fourth pipeline; and
  the diversion system comprising a third operating mode, wherein when the diversion system is in the third operating mode, the second pipeline and the fourth pipeline are conducting, and the first pipeline and the third pipeline are closed; the pumping apparatus extracts the cooling medium from the storage tank by means of the fourth pipeline, and conveys the cooling medium back to the storage tank by the second pipeline; and the first filter filters the cooling medium flowing therethrough.

5. The diversion system according to claim 4, wherein the first filter is disposed in the storage tank.

6. The diversion system according to claim 4, further comprising a controller for controlling conducting or closing the first pipeline, the second pipeline, the third pipeline, and the fourth pipeline, and a first detector for detecting purity of the cooling medium in the storage tank, the first detector in communicative connection to the controller; and when the first detector detects the purity of the cooling medium in the storage tank is less than a preset value, the controller controls the second pipeline and the fourth pipeline to be conducting and the first pipeline and the third pipeline to be closed, so as to switch the diversion system to the third operating mode.

7. The diversion system according to claim 1, further comprising a second filter provided in communication with the first pipeline or the third pipeline; and the diversion system comprising a fourth operating mode, wherein when the diversion system is in the fourth operating mode, the first pipeline and the third pipeline are conducting, and the second pipeline and the fourth pipeline are closed; the pumping apparatus extracts the cooling medium from the cooling device by the third pipeline, and conveys the cooling medium to the cooling device by the first pipeline; and the second filter filters the cooling medium flowing therethrough.

8. The diversion system according to claim 7, further comprising a controller for controlling conducting or closing of the first pipeline, the second pipeline, the third pipeline, and the fourth pipeline, and a second detector for detecting purity of the cooling medium in the cooling device, the second detector in communicative connection to the controller; wherein when the second detector detects the purity of the cooling medium in the cooling device is less than a preset value, the controller controls the first pipeline and the third pipeline to be conducting and the second pipeline and the fourth pipeline to be closed, so as to switch the diversion system to the fourth operating mode.

9. The diversion system according to claim 1, wherein the first pipeline, the second pipeline, the third pipeline, and the fourth pipeline are provided with a valve; and the valve can be opened or closed so that a corresponding pipeline in the first pipeline, the second pipeline, the third pipeline, and the fourth pipeline is conducting or closed.

10. The diversion system according to claim 1, wherein the first pipeline and the second pipeline are connected to a first common pipeline by a three-way connector, and both the first pipeline and the second pipeline are connected to the outlet of the pumping apparatus by the first common pipeline.

11. The diversion system according to claim 1, wherein the third pipeline and the fourth pipeline are connected to a second common pipeline by a three-way connector, and both the third pipeline and the fourth pipeline are connected to the inlet of the pumping apparatus by the second common pipeline.

12. The diversion system according to claim 1, wherein the first pipeline and the third pipeline are connected to a third common pipeline by means of a three-way connector, and both the first pipeline and the third pipeline are connected to the cooling device by the third common pipeline.

13. A diversion system applicable to a cooling device, the diversion system comprising:

a storage tank and a pumping apparatus, the storage tank for storing a cooling medium, and the pumping apparatus comprising an inlet and an outlet;

a first pipeline connected between the cooling device and the outlet of the pumping apparatus, a second pipeline connected between the storage tank and the outlet of the pumping apparatus, a third pipeline connected between the cooling device and the inlet of the pumping apparatus, a fourth pipeline connected between the storage tank and the inlet of the pumping apparatus, and the first pipeline, the second pipeline, the third pipeline, and the fourth pipeline selectively conducting or closed; wherein when the diversion system is operating, at least two of the first pipeline, the second pipeline, the third pipeline, and the fourth pipeline are conducting.

14. A cooling system comprising a first storage tank, a second storage tank and a pumping apparatus, the first storage tank and the second storage tank for storing a cooling medium, the first storage tank communicating with the second storage tank by the pumping apparatus, and the cooling system is configured to operate in one of a first mode and a second mode; wherein in the first mode, the cooling medium in the first storage tank is introduced into the second storage tank by the pumping apparatus; in the second mode, the cooling medium in the second storage tank is introduced into the first storage tank by the pumping apparatus; and in the first mode and the second mode, direction of the cooling medium flowing through the pumping apparatus are the same.

15. The cooling system of claim 14, wherein in the first mode, the first pipeline and the fourth pipeline are conducting, and the second pipeline and the third pipeline are closed;

the pumping apparatus extracts cooling medium from the storage tank by the fourth pipeline, and conveys the cooling medium into the cooling device by the first pipeline; and in the second mode, the second pipeline and the third pipeline are conducting, and the first pipeline and the fourth pipeline are closed; and the pumping apparatus extracts the cooling medium from the cooling device by the third pipeline, and conveys the cooling medium into the storage tank by the second pipeline.

16. The cooling system according to claim 15, further comprising a controller for controlling conducting or closing of the first pipeline, the second pipeline, the third pipeline, and the fourth pipeline, and a measuring meter for detecting a volume of the cooling medium in the cooling device, the measuring meter in communicative connection to the controller; wherein when the measuring meter detects the volume of the cooling medium in the cooling device is less than a first volume, the controller controls the first pipeline and the fourth pipeline to be conducting and the second pipeline and the third pipeline to be closed, so as to switch the diversion system to the first mode, and when the measuring meter detects the volume of the cooling medium in the cooling device exceeds a second volume, the controller controls the second pipeline and the third pipeline to be conducting and the first pipeline and the fourth pipeline to be closed, so as to switch the cooling system to the second mode, wherein the second volume is greater than the first volume.

17. The cooling system according to claim 15, further comprising a first filter in communication with the second pipeline or the fourth pipeline; and configured to operate in a third mode, wherein when the cooling system is in the third mode, the second pipeline and the fourth pipeline are conducting, and the first pipeline and the third pipeline are closed; the pumping apparatus extracts the cooling medium from the storage tank by means of the fourth pipeline, and conveys the cooling medium back to the storage tank by the second pipeline; and the first filter filters the cooling medium flowing therethrough.

18. The cooling system according to claim 17, wherein the first filter is disposed in the storage tank.

19. The cooling system according to claim 17, further comprising a controller for controlling conducting or closing the first pipeline, the second pipeline, the third pipeline, and the fourth pipeline, and a first detector for detecting purity of the cooling medium in the storage tank, the first detector in communicative connection to the controller; and when the first detector detects the purity of the cooling medium in the storage tank is less than a preset value, the controller controls the second pipeline and the fourth pipeline to be conducting and the first pipeline and the third pipeline to be closed, so as to switch the cooling system to the third mode.

20. The cooling system according to claim 15, further comprising a second filter in communication with the first pipeline or the third pipeline; and configured to operate in a fourth mode, wherein when in the fourth mode, the first pipeline and the third pipeline are conducting, and the second pipeline and the fourth pipeline are closed; the pumping apparatus extracts the cooling medium from the cooling device by the third pipeline, and conveys the cooling medium to the cooling device by the first pipeline; and the second filter filters the cooling medium flowing therethrough.

* * * * *